United States Patent [19]

Salles et al.

[11] 4,113,543
[45] Sep. 12, 1978

[54] APPARATUS FOR ETCHING THE EDGES OF SEMICONDUCTOR PLATES

[75] Inventors: Yvon Salles, Epron; Pierre Léger, Thaon; Gérard André David, Caen, all of France

[73] Assignee: U.S. Philips Corporation, New York, N.Y.

[21] Appl. No.: 729,345

[22] Filed: Oct. 4, 1976

[30] Foreign Application Priority Data

Oct. 3, 1975 [FR] France ................. 75 30332

[51] Int. Cl.$^2$ ........................................ H01L 21/306
[52] U.S. Cl. ........................ 156/345; 156/639; 156/654
[58] Field of Search ............... 156/345, 637, 640, 636, 156/662, 654, 639; 134/137, 140, 149, 157

[56] References Cited

U.S. PATENT DOCUMENTS 3,964,957 6/1976 Walsh ..................... 156/345

OTHER PUBLICATIONS

IBM Technical Disclosure Bulletin, vol. 8, No. 12, May 1966, Semiconductor Wafer Handling Apparatus for Chemical Etching Operations by C. E. Hallas, p. 1845.

*Primary Examiner*—William A. Powell
*Attorney, Agent, or Firm*—Frank R. Trifari; David R. Treacy

[57] ABSTRACT

A mechanochemical method of etching the side wall of circular semiconductor plates, and apparatus for performing the method. The plates are given a rotary movement while their side walls only are contacted with an etching solution, the rotary movement being produced by rotation of at least one cylindrical roller dragging along a film of the etching solution.

4 Claims, 2 Drawing Figures

APPARATUS FOR ETCHING THE EDGES OF SEMICONDUCTOR PLATES

BACKGROUND OF THE INVENTION

1. Field of the Invention

The invention relates to a method of mechanochemical etching of the side wall of semiconductor plates whose main faces are substantially circular, and to an apparatus for carrying out the method.

It is known that, in order to obtain certain semiconductor devices, notably diodes and in particular solar cells, a p-n junction is formed by diffusing n-type impurities from all the walls of a p-type plate serving as a substrate, and also from the side walls.

The following operation then consists of making contacts on the P and N type regions. The contact on the N region is made in a simple and rapid manner but when making contacts on the P region numerous difficulties occur. Until now the most certain solution consists in the diffusion of impurities of aluminium from a region of the surface of the N layer into the P region to obtain a contact area at the surface.

No matter what method is adopted, it is advisable, however, to eliminate the diffused N type region from the side walls so as to prevent possible short-circuits.

2. Description of the Invention

Until now, removal of the N layer has been performed mechanically and has been manually controlled, the most simple method consisting of grinding the side wall by means of an abrasive until the original P region appears. The success of this method depends upon the ability of the operator so that the results obtained are generally not reproducible. In addition, the grinding thickness is not uniform and facets and ridges may be formed which are fragile.

In addition, grinding presents the drawback of creating a perturbation of the crystal lattice in the proximity of the ground region, the result of said perturbation being a diminishing of the photoelectronic efficiency of the ground semiconductor plate.

These drawbacks are accentuated in the case of circular semiconductor plates generally used for the manufacture of solar cells.

Another recommended method consists of dipping the semiconductor plates in a bath containing an etching solution, after first having covered the two main faces of the plates with an etchant-resistant layer, for example picein. Such a method requires additional steps and handling, and increased care. Moreover, the results are not always effective, nor reproducible. Actually, the protective layer does not necessarily have a uniform thickness nor a complete adherence to the surface to be protected; as a result infiltration of etching solution may occur and produce defects in the active regions of the already manufactured plate.

None of the known methods, particularly those described above permits automation of the operation so as to reduce its cost.

SUMMARY OF THE INVENTION

It is the object of the present invention to provide a solution to the various problems that takes advantage of the fact that the semiconductor plates used in most current applications, notably in the form of solar cells, are circular plates.

According to the present invention in a mechanochemical method of etching the side wall of semiconductor plates whose main faces are substantially circular, the plates are given a substantially uniform rotary movement while their side walls only are contacted with at least a film of the etching solution.

Advantageously, the rotary movement of the plates is produced by means of at least one circular cylindrical roller, said roller being covered with a film of the etching solution which touches the side wall of the plates, the main faces of each of the plates being maintained substantially perpendicular to the longitudinal axis of the roller by suitable means.

In a preferred embodiment, the rotary movement of the plates is produced by two circular cylindrical rollers having substantially parallel longitudinal axes, separated by a suitable distance and rotating in the same direction at the same speed or selected different speeds, the said rollers being covered with films of the etching solution which touch the side walls of the plates, the main faces of each of the plates being maintained substantially perpendicular to the axis of the said rollers by suitable means.

The axes of the rollers are preferably substantially horizontal and the plates are vertical.

Moreover, the lower part of the rollers is situated in a bath containing the etching solution and the speed of rotation of each of the rollers is established so as to create a film of the etching solution starting from the bath and taking into account the nature and the viscosity of the solution, to maintain the film in a rotary movement.

Usually the semiconductor plates are silicon and in this case the etching solution is constituted by hydrofluoric acid, nitric acid and acetic acid to which water may be added.

This method presents numerous advantages. First, it permits uniform etching throughout the length of the side wall. Second, the etching results are reproducible and do not require special precautions during or after the etching process.

Finally, the method is so simple that automation of the process is not difficult and it is thus possible to simultaneously treat a plurality of plates.

The present invention also relates to an apparatus for mechanochemical etching of the side wall of substantially circular semiconductor plates using the above-described method, comprising a container for the etching solution, in which at least one roller having a horizontal longitudinal axis and a, circular cylindrical surface is mounted for rotation about its axis, and means for maintaining the semiconductor plates to be etched in a vertical position.

Preferably, the apparatus according to the invention comprises two cylindrical rollers having a horizontal longitudinal axis, at least one being capable of rotating. In a first preferred embodiment the two rollers rotate in the same direction at different speeds. In this case the slower-rotating roller is arranged to have greater friction with the plates and so provides a more accentuated etching.

In a second preferred embodiment the two rollers rotate in the same direction and at the same speed. This solution is by far the simple and hence the easiest to perform.

In this case, in order to ensure the identity of speed of the two rollers, they are coupled and their rotation is produced by the rotary movement of one of the fixed rollers by means of a driving mechanism situated outside the container.

In order to maintain each of the plates in a vertical position, the apparatus preferably includes a device shaped like a fork having at least two teeth, the plates being guided in the space between the teeth.

The material used for the manufacture of the apparatus should be rigid and be very resistant to the etching solution, which is why, if the above-described solution comprising hydrofluoric acid, nitric acid and acetic acid and water is used, it is preferred to use polytetrafluoroethylene as a material.

BRIEF DESCRIPTION OF THE DRAWING

The invention will now be described in greater detail with reference to the accompanying drawing, in which.

DESCRIPTION OF THE PREFERRED EMBODIMENT

Figure 1:
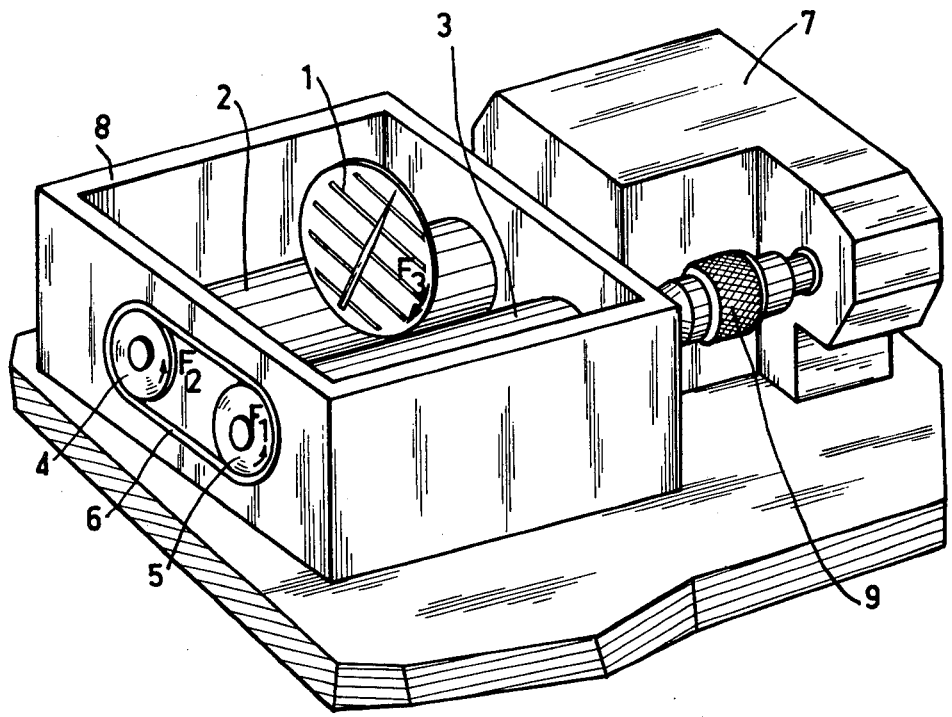
FIG. 1 is a perspective view of a simple apparatus for carrying out the method according to the invention.

As is shown in FIG. 1, the semiconductor plate 1 of which the side wall is to be etched is placed vertically plain cylindrical rollers 2 and 3 which are coupled by two pulleys 4 and 5 and a belt 6 running in the pulley grooves. One of the rollers is given a rotary movement by a motor 7 and the belt coupling of the rollers causes them to rotate simultaneously.

The two rollers are mounted in a closed container 8 containing the etching solution, the lower parts of the roller's cylindrical surfaces being submerged in the solution, the pulleys 4 and 5 as well as the coupling 9 between the rollers 2 and 3 and the motor 7 being situated outside the said container 8.

During operation, the motor gives the roller 3 a rotary movement in the direction of the arrow $F_1$, which gives the roller 2 a rotary movement in the same direction denoted by the arrow $F_2$. If the plate 1 is maintained vertically on the two rollers 2 and 3 by suitable means, the plate is automatically given a rotary movement in the opposite direction denoted by the arrow $F_3$.

By suitable choice of the speed of rotation of the rollers 2 and 3, the etching solution in the container 8 into which the roller surfaces dip forms a film which envelops the rollers and etches the side wall of the plate 1.

Figure 2:
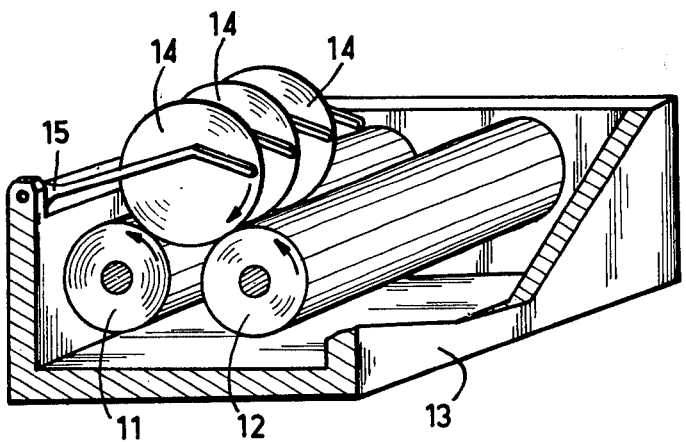
FIG. 2 is a perspective view, partly in section, of an alternative apparatus for etching several plates.

As is shown in FIG. 2, in an apparatus comprising the rollers 11 and 12 placed in a container 13 containing the etching solution, the lower portions of the rollers dipping into the solution as described above, a plurality of plates 14 can be treated simultaneously by maintaining them vertically with the aid of a support 15 in the form of a fork whose teeth form one assembly with the wall of the container 13, the axis of the support being, for example, parallel to the longitudinal axis of the rollers 11 and 12.

The speed of rotation of the rollers is chosen as a function of the diameter of the plates to be etched, of the diameter of the rollers and of the viscosity of the etching solution. For example, if the diameter of the plates is of the order of 50 mm, the speed of rotation of the rollers, which have a diameter at most equal to that of the plates, is between 10 and 20 rpm. At 15 rpm, for example, the etching lasts 30 seconds to remove 0.4 μm of material, if the etching solution contains 10% FH, 81% $NO_3H$ and 9% $CH_3COOH$.

What is claimed is:

1. An apparatus for mechanochemical etching of the side wall of a circular plate, comprising a container for receiving an etching solution, at least one roller having a longitudinal axis and a circular cylindrical surface, means for mounting said roller in said container so that its longitudinal axis is horizontal and a lower portion only of said surface the roller is submerged in etching solution, means for rotating said roller about said axis, and means for holding a plate with its side wall in rolling contact with said roller surface only and above said etching solution, said plate being in a vertical position with faces of the plate perpendicular to the roller axis.

2. An apparatus as claimed in claim 1 comprising two rollers having their longitudinal axes parrallel with lower portions only submerged in said etching solution, said rollers and said holding means arranged so that a plate in rolling contact with both rollers is above said solution.

3. An apparatus as claimed in claim 2, comprising first external means for rotating a first one of said rollers, and second external means for rotating the second one of said rollers in response to rotation of said first roller.

4. An apparatus as claimed in claim 2 wherein said holding means comprises fork means for maintaining plates being etched in a vertical position, the fork means comprising at least two teeth arranged for contacting faces only of a plate being etched.

* * * * *